(12) United States Patent
Song

(10) Patent No.: US 7,800,129 B2
(45) Date of Patent: Sep. 21, 2010

(54) OPTICAL DEVICE WITH QUANTUM WELL

(75) Inventor: Dae-sung Song, Gyeonggi-do (KR)

(73) Assignee: Samsung Electronics Co., Ltd., Gyeonggi-gu (KR)

( * ) Notice: Subject to any disclaimer, the term of this patent is extended or adjusted under 35 U.S.C. 154(b) by 525 days.

(21) Appl. No.: 11/798,847

(22) Filed: May 17, 2007

(65) Prior Publication Data

US 2007/0221909 A1 Sep. 27, 2007

(51) Int. Cl.
*H01L 31/0328* (2006.01)
*H01L 31/0336* (2006.01)
*H01L 31/072* (2006.01)
*H01L 31/109* (2006.01)

(52) U.S. Cl. ..................... 257/189; 257/14; 257/201

(58) Field of Classification Search ............... 257/13, 257/14, 18, 21, 79, 85, 97, 103, 189, 191, 257/201
See application file for complete search history.

(56) References Cited

U.S. PATENT DOCUMENTS

| 5,412,225 A | 5/1995 | Dutta et al. |
| 5,606,176 A | 2/1997 | Nitta |
| 6,100,543 A | 8/2000 | Sakata |
| 6,859,474 B1 | 2/2005 | Johnson et al. |

*Primary Examiner*—Thien F Tran
(74) *Attorney, Agent, or Firm*—Harness, Dickey & Pierce, P.L.C.

(57) ABSTRACT

An optical device with a quantum well is provided. The optical device includes an active layer made of a Group III-V semiconductor compound and having a quantum well of a bandgap grading structure in which conduction band energy and valence band energy change linearly with a slope with the content change of predetermined components while an energy bandgap between the conduction band energy and the valence band energy is maintained at a predetermined value; and two barrier layers, one of which is positioned on an upper surface of the active layer and the other is positioned on a lower surface of the active layer, and which are made of a Group III-V semiconductor compound and have higher conduction band energy and lower valence band energy than the active layer. A driving voltage is decreased and luminous efficiency and reliability are enhanced.

9 Claims, 7 Drawing Sheets

OPTICAL DEVICE WITH QUANTUM WELL

This application claims the priority of Korean Patent Application No. 2003-1609, filed on Jan. 10, 2003, in the Korean Intellectual Property Office, the disclosure of which is incorporated herein in its entirety by reference.

BACKGROUND OF THE INVENTION

1. Field of the Invention

The present invention relates to an optical device with a quantum well, and more particularly, to an optical device with a quantum well with improved luminous efficiency and reliability.

2. Description of the Related Art

A quantum well is a structure formed by inserting between two different semiconductor layers a thin semiconductor layer having an energy bandgap much smaller than those of the two semiconductor layers. Carriers such as electrons or holes are confined in the quantum well by energy barriers. Studies on the quantum well have been actively conducted because an optical device with the quantum well can generate a large amount of light even at a small driving voltage.

FIGS. 1A and 1B are diagrams of a quantum well structure in a conventional optical device before and after applying a driving voltage, respectively.

Referring to FIG. 1A, an optical device comprises first and second barrier layers D and D' having high conduction band energy and low valence band energy, and an active layer E formed between the first and second barrier layers D and D' and having lower conduction band energy and higher valence band energy than the first and second barrier layers D and D'. Before applying a driving voltage, the conduction band energy of the active layer E corresponding to the bottom of the quantum well structure exhibits a constant energy level.

When driving voltage is applied, electrons and holes are rearranged so that the quantum well structure has an asymmetrical distribution of electrons and holes, as shown in FIG. 1B. Referring to FIG. 1B, the conduction band energy and the valence band energy of the active layer E change linearly with a slope. In this case, most electrons and holes are respectively distributed in the conduction band quantum well and the valence band quantum well in such a way to face each other diagonally, thereby decreasing the recombination efficiency of electrons and holes.

In particular, in an optical device in which an active layer having a quantum well structure is made of a GaInNAs semiconductor material, N. and In does not easily grow into a crystal due to unstable combination. Also, due to the addition of N, luminous efficiency and lifetime may be lowered.

SUMMARY OF THE INVENTION

The present invention provides an optical device with a quantum well which is improved in luminous efficiency.

According to an aspect of the present invention, there is provided an optical device comprising: an active layer made of a Group III-V semiconductor compound and having a quantum well of a bandgap grading structure in which conduction band energy and valence band energy change linearly with a slope with the content change of predetermined components while an energy bandgap between the conduction band energy and the valence band energy is maintained at a predetermined value; and two barrier layers, one of which is positioned on an upper surface of the active layer and the other is positioned on a lower surface of the active layer, and which are made of a Group III-V semiconductor compound and have higher conduction band energy and lower valence band energy than the active layer.

The active layer may be made of $Ga_{1-x}In_xN_yAs_{1-y}$ where $0<x<1$ and $0<y<1$. The predetermined components may be In and N. Preferably, $0<x\leqq0.3$ and $0<y\leqq0.2$.

The barrier layers may be made of $Al_xGa_{1-x}As$ where $0<x<1$.

An intermediate layer may be interposed between the active layer and each of the barrier layers to reduce a compressive strain. The intermediate layer may be made of $Ga_{1-x}In_xAs$ where $0<x<0.6$ or $GaN_xAs_{1-x}$ where $0<x<0.1$.

The energy bandgap of the active layer may be maintained at 1 eV or less. The difference between the highest valence band energy and the lowest valence band energy of the active layer may be 0.3 eV or more. The barrier layers may have an energy bandgap of 1.2 to 3.4 eV.

According to another aspect of the present invention, there is provided an optical device comprising: two active layers formed one onto the other, made of a Group III-V semiconductor compound, and having a quantum well of a bandgap step structure in which conduction band energies and valence band energies have different energy levels while energy bandgaps between the conduction band energies and the valence band energies are maintained at a predetermined value; and two barrier layers, one of which is positioned on an upper surface of one of the active layers and the other is positioned on a lower surface of the other active layer, and which are made of a Group III-V semiconductor compound and have higher conduction band energy than the highest conduction band energy of the active layers and lower valence band energy than the lowest valence band energy of the active layers.

The active layers may be made of $In_xGa_{1-x}As$ where $0<x<1$ and $GaN_xAs_{1-x}$ where $0<x<1$, respectively. The barrier layers may be made of $Al_xGa_{1-x}As$ where $0<x<1$.

Intermediate layers may be interposed between one of the active layers and one of the barrier layers and between the other active layer and the other barrier layer. The intermediate layers may be made of $Ga_{1-x}In_xAs$ where $0<x<0.6$ or $GaN_xAs_{1-x}$ where $0<x<0.1$.

The energy bandgaps of the active layers may be maintained at 1 eV or less. The difference between the valence band energies of the active layers may be 0.3 eV or more. The barrier layers may have an energy bandgap of 1.2 to 3.4 eV.

An optical device according to the present invention has a bandgap grading structure so that the conduction and valence band energies of a quantum well have a predetermined linear slope, or alternatively, has a bandgap step structure using a plurality of active layers. Therefore, electrons and holes can be symmetrically distributed when a driving voltage is applied. Consequently, the recombination rate of electrons and holes increases, thereby enhancing the luminous efficiency and reliability of the optical device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, optical devices according to embodiments of the present invention will be described in detail with reference to the accompanying drawings.

Figure 2A:
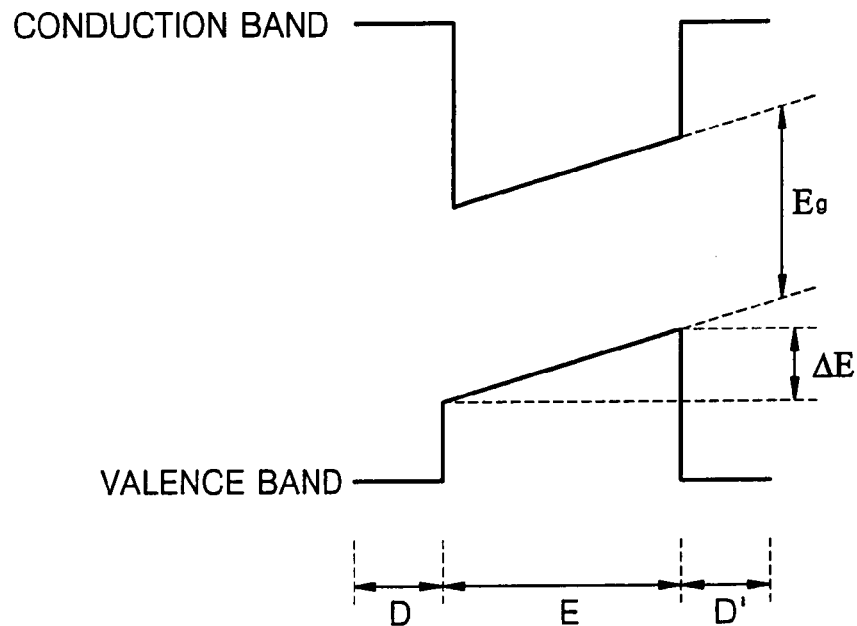
FIG. 2A is a schematic diagram of a quantum well structure of an optical device according to a first embodiment of the present invention before applying a driving voltage.

FIG. 2A is a schematic diagram of a quantum well structure of an optical device according to a first embodiment of the present invention. Referring to FIG. 2A, the conduction band energies and the valence band energies of two barrier layers D and D' have constant energy levels and are separated from each other by the constant energy bandgap. An active layer E is positioned between the two barrier layers D and D'. The conduction band energy and valence band energy of the active layer changes linearly with a slope. Such a quantum well structure of the active layer E is designated a bandgap grading structure. Here, the active layer E has the same energy bandgap (Eg) at all positions and the same band offset ($\Delta E$) at the energy bands.

Figure 2B:
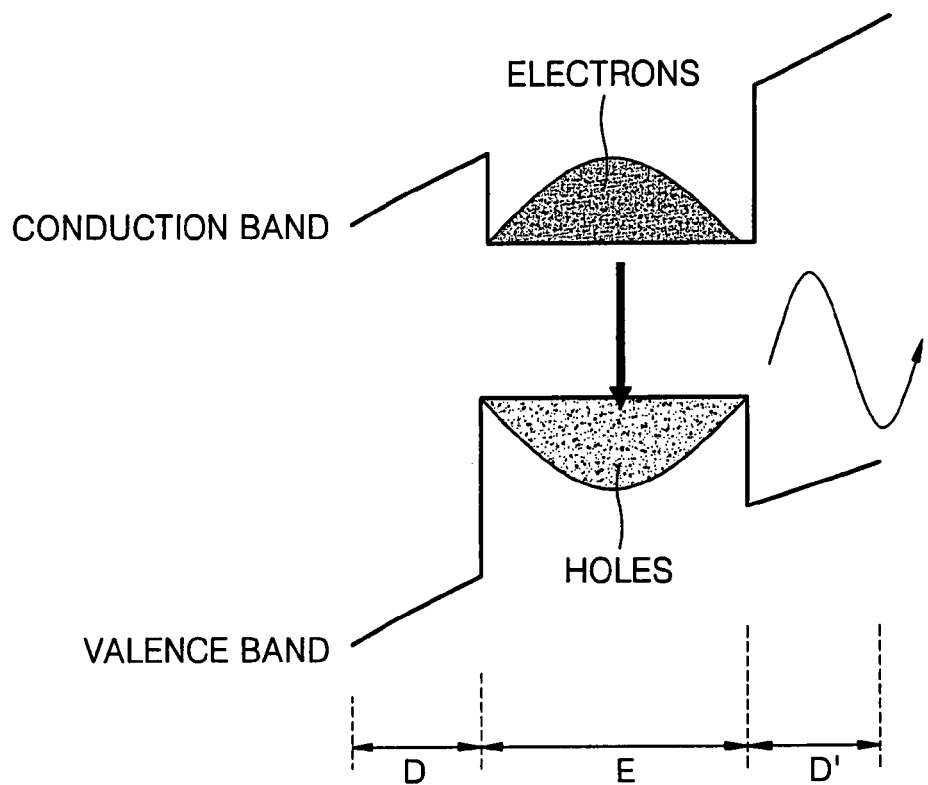
FIG. 2B is a schematic diagram of the quantum well structure of an optical device according to the first embodiment of the present invention after applying a driving voltage.

FIG. 2B shows the quantum well structure of an optical device shown in FIG. 2A after applying a driving voltage.

Figure 1A:
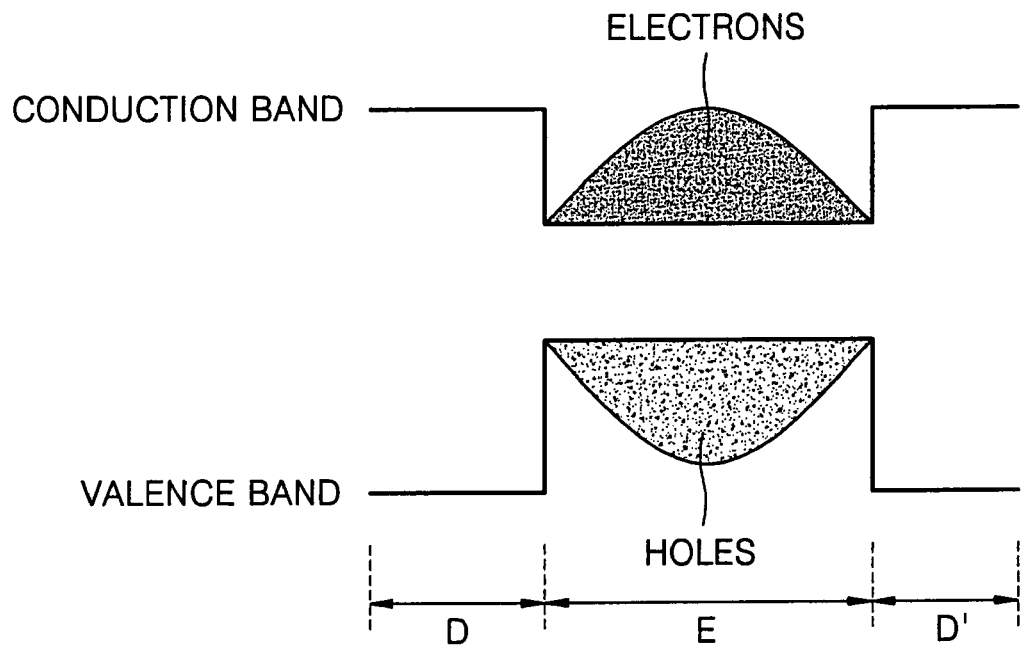
FIG. 1A is a schematic diagram of a quantum well structure of a conventional optical device before applying a driving voltage.
Figure 1B:
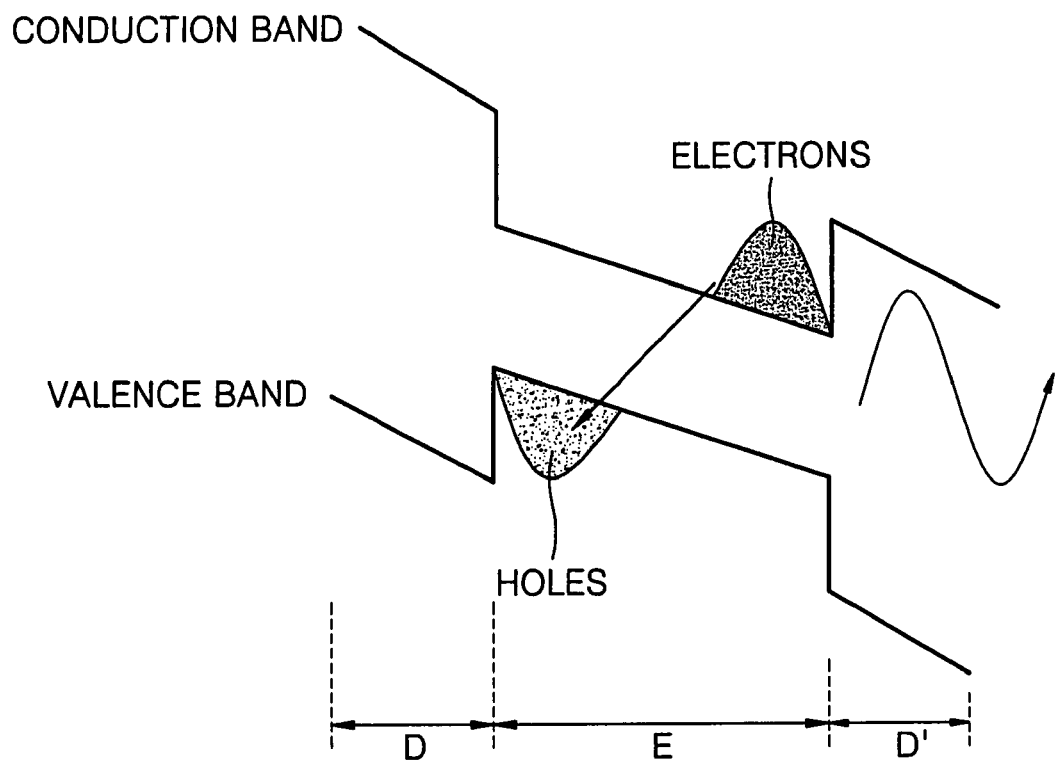
FIG. 1B is a schematic diagram of a quantum well structure of a conventional optical device after applying a driving voltage.

Referring to FIG. 2B, unlike the quantum well structure shown in FIG. 2A, the conduction and valence band energies of the barrier layers D and D' change linearly with a slope. The conduction and valence band energies of the active layer E have constant energy levels. This quantum well structure is in contrast with the quantum well structure exhibiting the asymmetrical distribution of electrons and holes after applying a driving voltage in the conventional optical device as shown in FIG. 1B. That is, when a driving voltage is applied in the quantum well structure shown in FIG. 2A, electrons move toward the barrier layer D' and holes move toward the barrier layer D', as shown in FIG. 2B. As a result, electrons and holes are distributed symmetrically. Due to such a symmetrical distribution of electrons and holes, the electrons and holes can easily recombine, thereby enhancing luminous efficiency.

Figure 3:
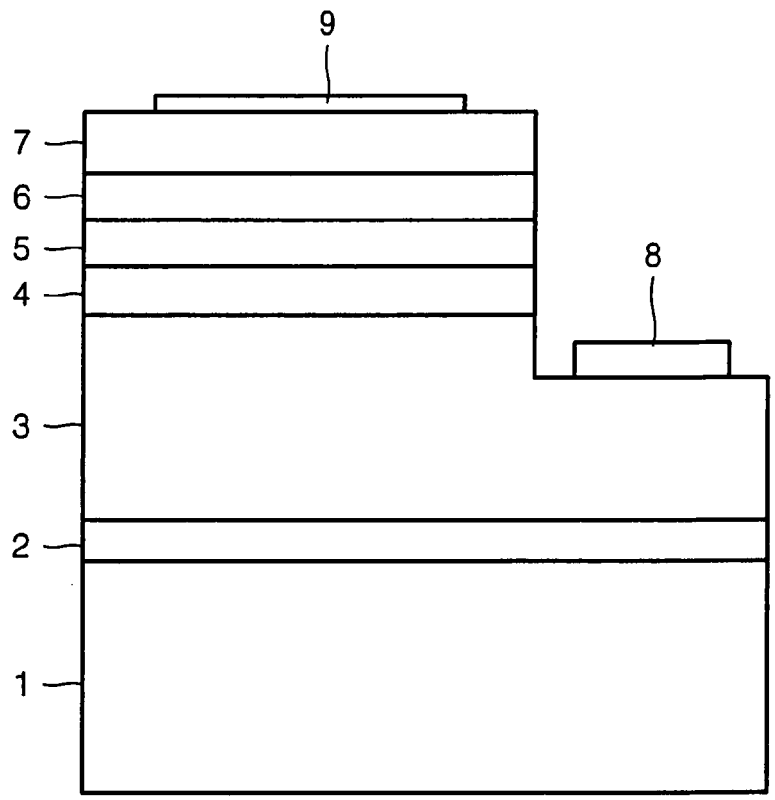
FIG. 3 is a schematic sectional view of an optical device according to the first embodiment of the present invention.

FIG. 3 is a schematic sectional view of a light emitting diode (LED) as an example of an optical device having the quantum well structure shown in FIG. 2A according to the first embodiment of the present invention.

A buffer layer 2 is formed on a substrate 1 and a first compound semiconductor layer 3 is formed on the buffer layer 2. The first compound semiconductor layer 3 is made of an n-type, Group III-V compound. An n-type electrode 8 is positioned on a step surface of the first compound semiconductor layer 3. A first barrier layer 4, an active layer 5, and a second barrier layer 6 are sequentially formed on the first compound semiconductor layer 3. A second compound semiconductor layer 7 made of a p-type, Group III-V compound is formed on the second barrier layer 6. A p-type electrode 9 is formed on the second compound semiconductor layer 7. Here, in a case where the first barrier layer 4 is made of an n-type, Group III-V compound and the second barrier layer 6 is made of a p-type, Group III-V compound, the active layer 5 is made of a nitrogen-containing, Group III-V compound. The active layer 5 has a bandgap grading structure.

Figure 4:
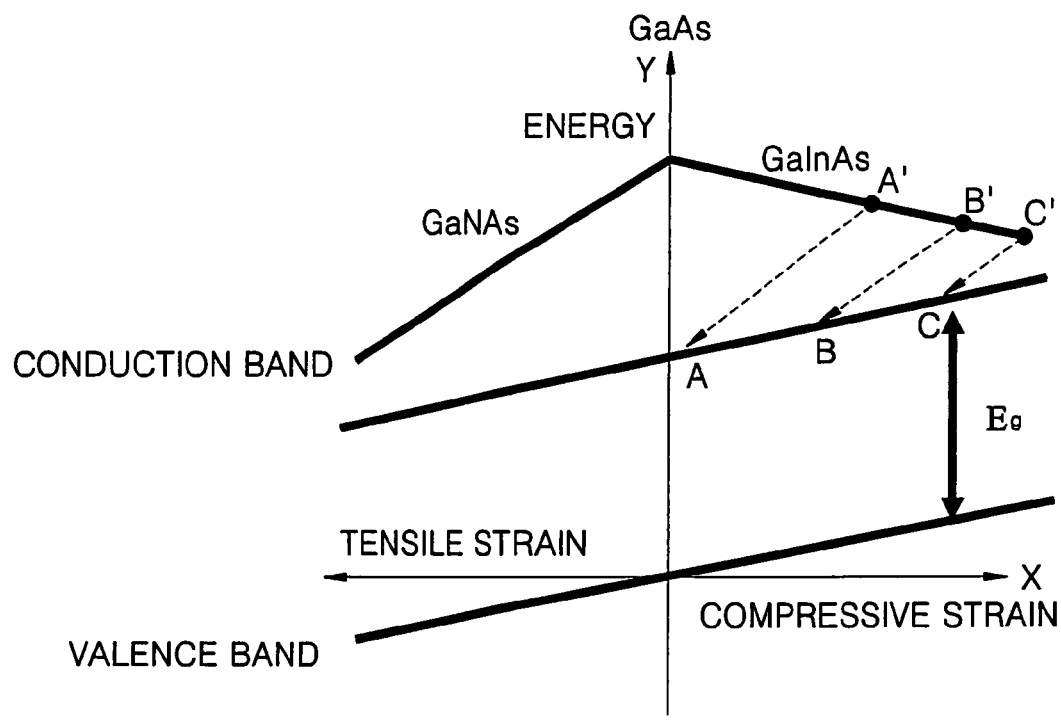
FIG. 4 is a schematic diagram showing a principle of a conduction band energy shift in an optical device according to the first embodiment of the present invention.

FIG. 4 illustrates a method of forming the quantum well structure shown in FIG. 2A. For this, the first and second barrier layers 4 and 6 are made of GaAs.

Referring to FIG. 4, the Y-axis is designed so that band energy increases in the positive Y-axis direction. The X-axis, perpendicular to the Y-axis, is designed so that a compressive strain increases in the positive X-axis direction and a tensile strain increases in the negative X-axis direction, on a basis of the GaAs. The negative X-axis shows the energy change and position of the valence and conduction bands of GaNAs relative to GaAs. On the other hand, the positive X-axis shows the energy change and position of the valence and conduction bands of GaInAs relative to the GaAs. The conduction band energy of the GaNAs increases in the direction of the positive X-axis, i.e., with decreasing the content of N. The conduction band energy of the GaInAs decreases in the direction of the positive X-axis, i.e., with increasing the content of In.

In the graph of the GaInAs, the In content of the GaInAs at a point C' is maximal and the In content of the GaInAs at a point A' is minimal. When N is incorporated to the GaInAs, the conduction band energy shifts from A' to A, from B' to B, and C' to C. That is, when predetermined amounts of In and N are incorporated to the GaAs, an energy band with a linear slope can be obtained, as shown in FIG. 4. At this time, the valence band energy also changes linearly with a slope. Therefore, the energy bandgap between the conduction and valence bands is maintained at Eg. Preferably, an optical device comprises an active layer made of an N-containing (0 to 10%), $In_xGa_{1-x}As$ where $0<x<1$ and a barrier layer made of $Al_xGa_{1-x}As$ where $0<x<1$.

Turning to FIG. 2A when the content of N varies within the range of 0 to 20% in the InGaAs containing 30% In, the band offset ($\Delta E$) is about 0.3 eV and the energy bandgap (Eg) is 0.95 eV. At this time, the energy bandgaps of the barrier layers D and D' may be set to a range of 1.2 to 2.4 eV, preferably 1.424 to 3.14 eV. The $\Delta E$ and Eg of the GaInNAs active layer may be selected from 0.3 eV or more and 1.0 eV or less, respectively.

When appropriate amounts of In and N are incorporated to the GaAs with gradually varying the amounts of In and N, an optical device having the conduction and valence band energies of the active layer with a desired linear slope can be obtained. However, in an optical device according to the first embodiment of the present invention, a sharp energy change may occur at points at which the conduction and valence bands of the barrier layers meet with those of the active layer, thereby generating a compression strain and a tensile strain. Due to such undesired strains, an optical device may have structural defect causing deterioration of luminous characteristics. In order to solve this problem, a new quantum well structure is shown in FIG. 5.

Figure 5:
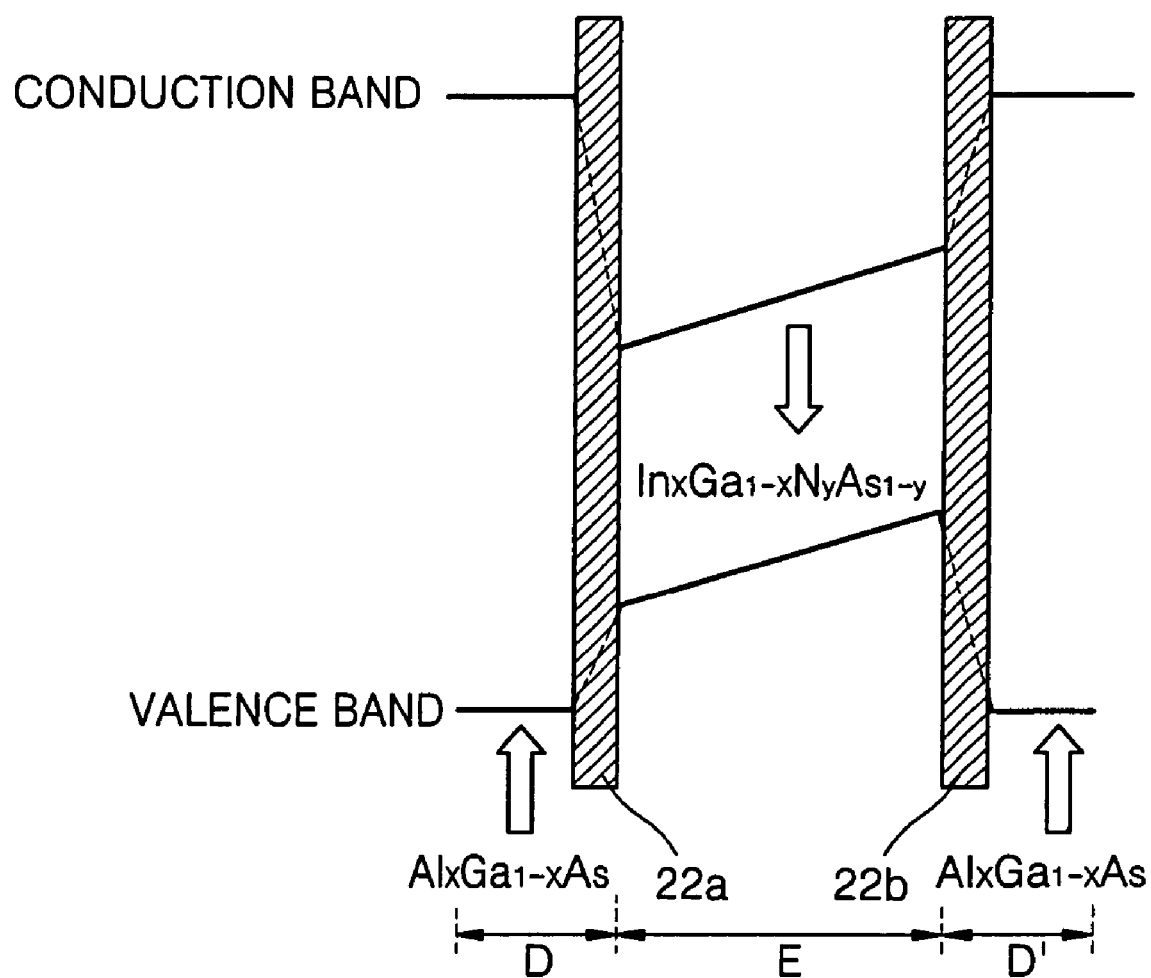
FIG. 5 is a schematic diagram of a quantum well structure of an optical device according to a second embodiment of the present invention.

FIG. 5 is a schematic diagram of a quantum well structure of an optical device according to a second embodiment of the present invention.

Referring to FIG. 5, in an optical device according to the second embodiment of the present invention, an active layer E made of $In_xGa_{1-x}N_yAs_{1-y}$ where $0<x<1$ and $0<y<1$ is interposed between first and second barrier layers D and D' made of $Al_xGa_{1-x}As$ where $0<x<1$. Intermediate layers 22a and 22b are respectively interposed between the active layer E and the first barrier layer D and between the active layer E and the second barrier layer D'. The intermediate layers may be made of $In_xGa_{1-x}As$ where $0<x<0.6$ to reduce a sharp change of a compressive strain between the barrier layers and the active layer. Alternatively, the intermediate layers may be made of $GaN_xAs_{1-x}$ where $0<x<0.1$ to compensate for the compressive strain of the active layer, thereby preventing the degradation of the active layer due to a compressive strain.

Figure 6A:
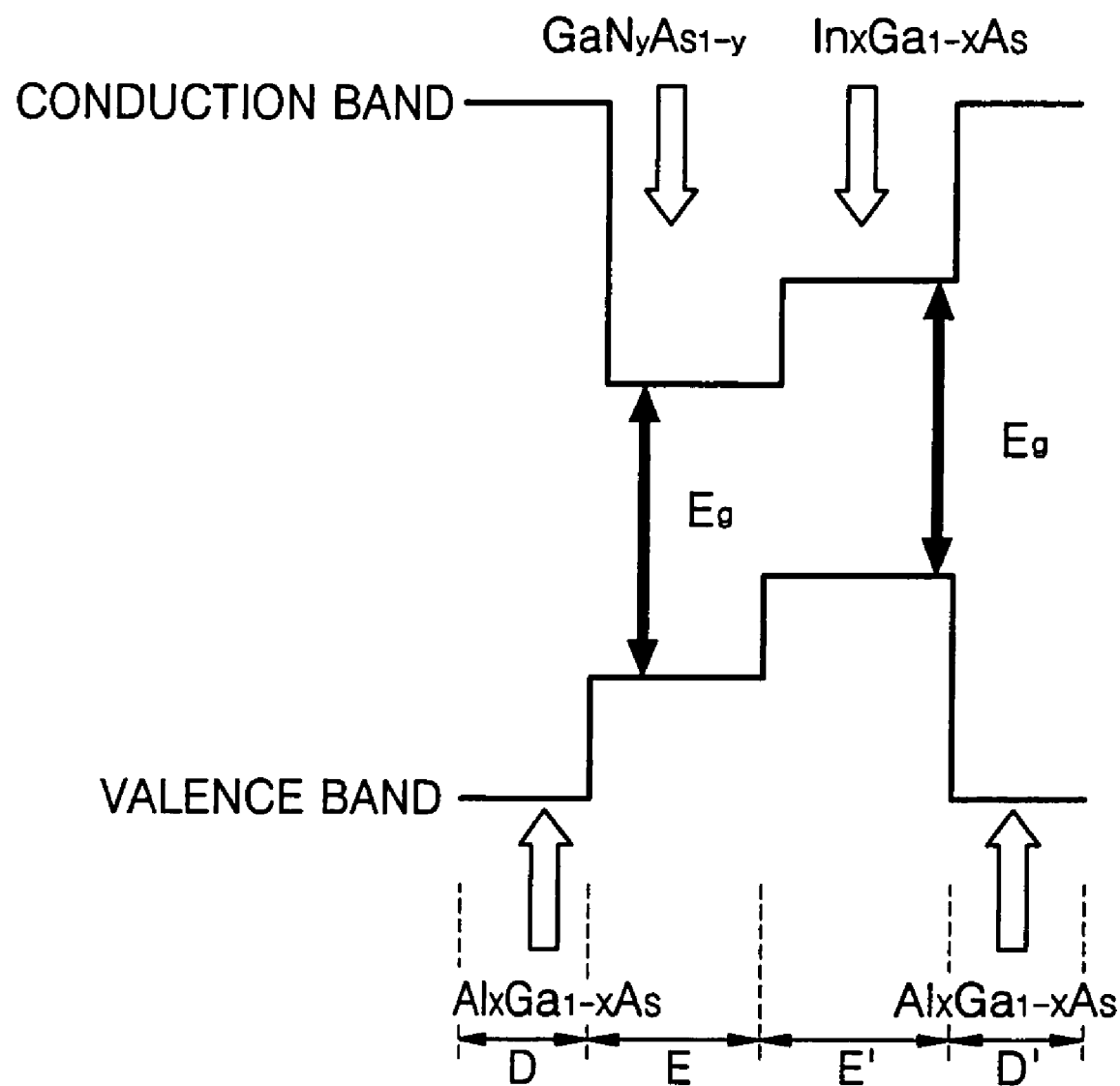
FIG. 6A is a schematic diagram of a quantum well structure of an optical device according to a third embodiment of the present invention before applying a driving voltage.

FIG. 6A is a schematic diagram of a quantum well structure of an optical device according to a third embodiment of the present invention before applying a driving voltage. Generally, an InGaNAs active layer has problems in that the interaction of In and N inhibits a crystal growth and the incorporation of N induces discharge of In, thereby causing a shift to a shorter wavelength band. In this regard, an optical device according to the third embodiment of the present invention comprises an InGaAs active layer E and a GaNAs active layer E' that are separately formed and a quantum well structure having an energy step between the two active layers E and E'. In the quantum well structure with an energy step, the two active layers E and E' have the same energy bandgaps between the conduction and valence band energies but different conduction and valence band energies.

Referring to 6A, an optical device according to the third embodiment of the present invention comprises the first and second active layers E and E' which have different conduction and valence band energies. The first active layer E is made of $GaN_xAs_{1-x}$ where $0<x<1$ and the second active layer E' is made of $In_xGa_{1-x}As$ where $0<x<1$. Although the first and second active layers E and E' have different conduction and valence band energy values, the energy bandgaps between the conduction bands and the valence bands are maintained constant as Eg.

Figure 6B:
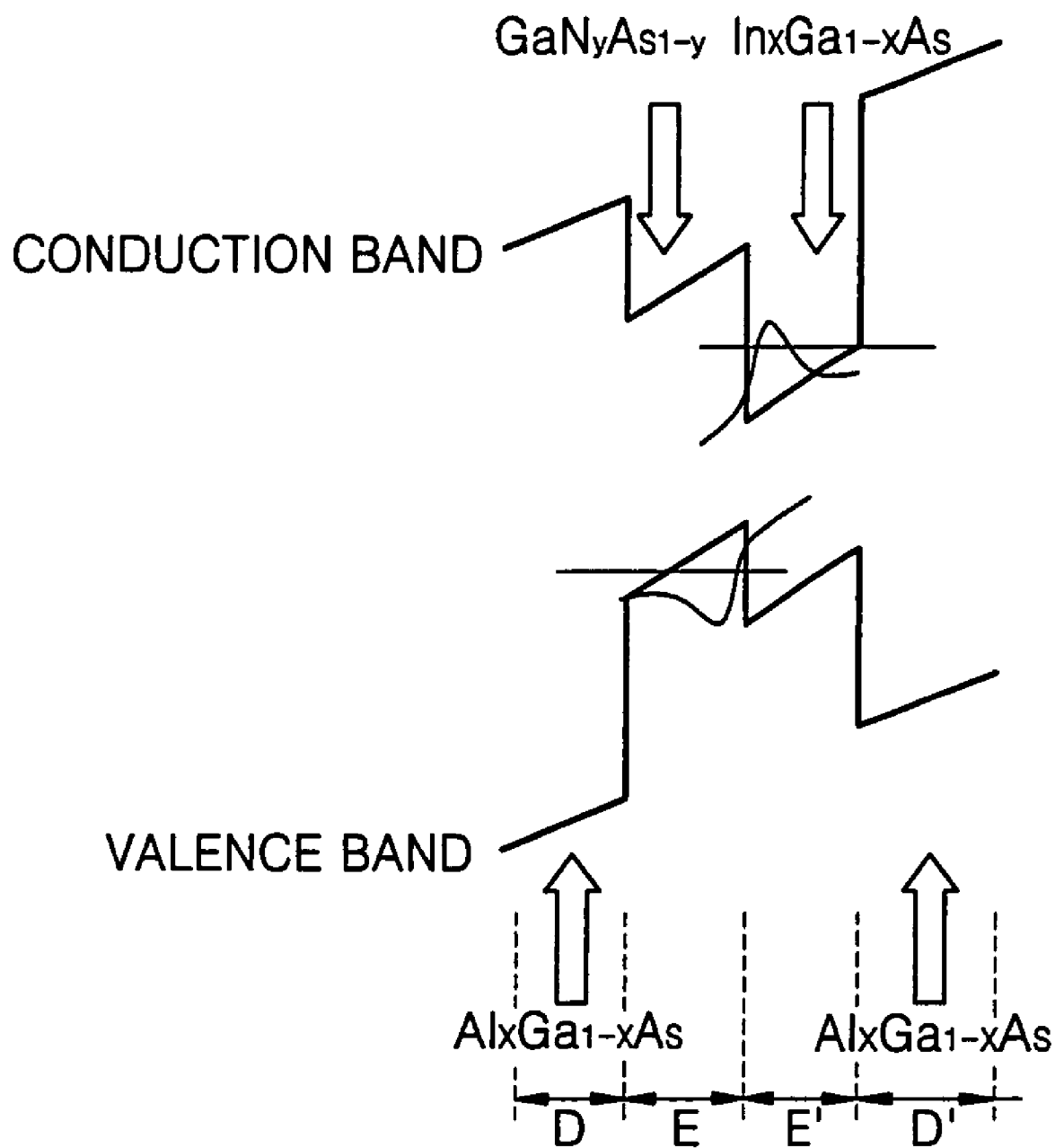
FIG. 6B is a schematic diagram of the quantum well structure of an optical device according to the third embodiment of the present invention after applying a driving voltage.

FIG. 6B is a schematic diagram of the quantum well structure of an optical device according to the third embodiment of the present invention after applying a driving voltage. Referring to FIG. 6B, all of the two barrier layers D and D' and the two active layers E and E' have the conduction and valence band energies of a predetermined linear slope. However, unlike the conventional quantum well structure shown in FIG. 1B, since the quantum wells of the active layers E and E' form a bandgap step structure, the degree of an asymmetric distribution of electrons and holes decreases.

Figure 7:
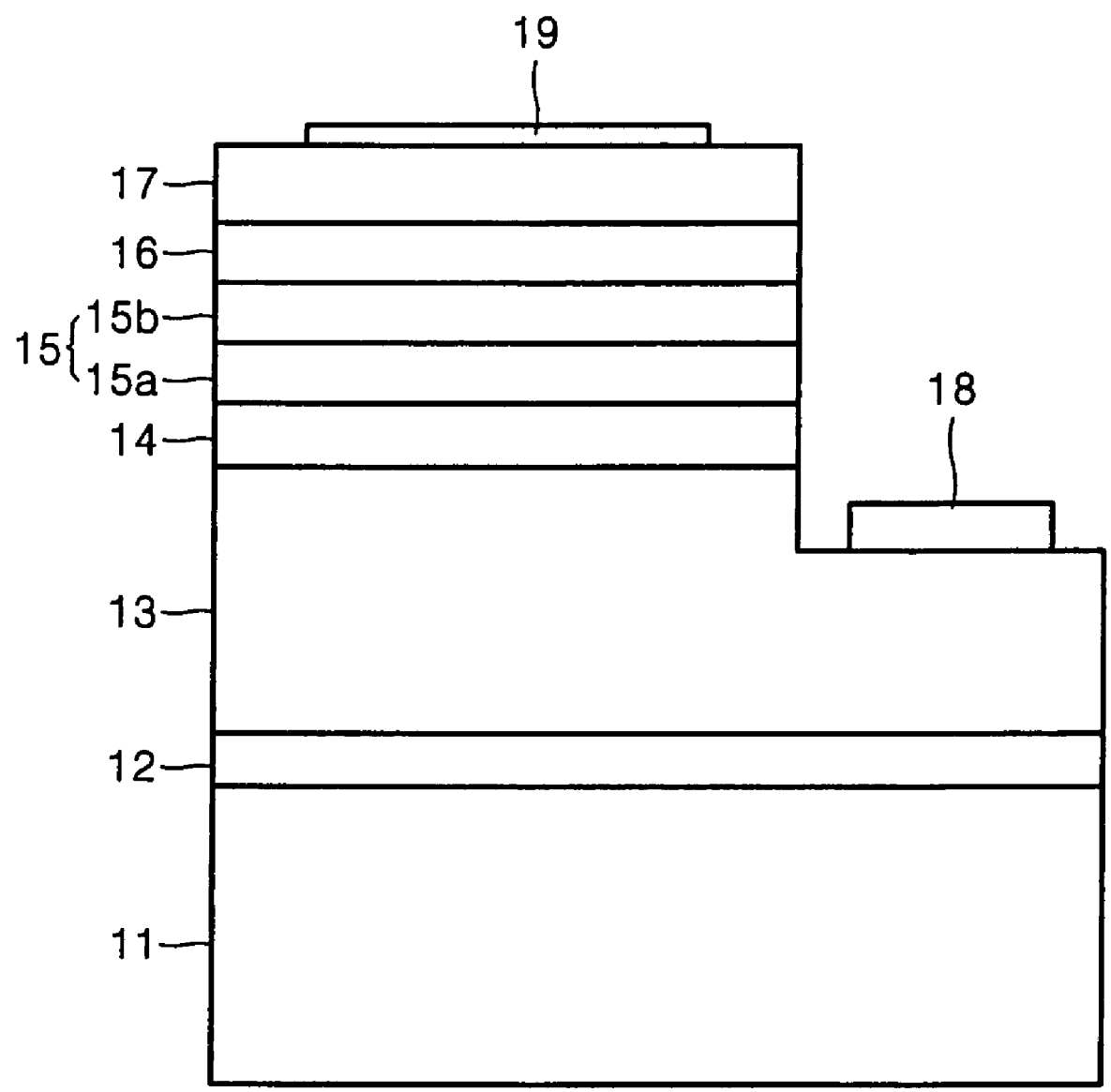
FIG. 7 is a schematic sectional view of an optical device according to the third embodiment of the present invention.

FIG. 7 is a schematic sectional view of a LED as an example of an optical device having the quantum well structure shown in FIG. 6 according to the third embodiment.

Referring to FIG. 7, a buffer 12, a first compound semiconductor layer 13, a first barrier layer 14, an active layer 15, a second barrier layer 16, and a second compound semiconductor layer 17 are sequentially formed on a substrate 11. An n-type electrode 18 is formed on a step surface of the first compound semiconductor layer 13. A p-type electrode 19 is formed on the second compound semiconductor layer 17. Such a structure of an optical device is similar to that in the first embodiment of the present invention. However, this embodiment is different from the first embodiment in that the active layer 15 consists of first and second active layers 15a and 15b made of different materials.

As described above, due to unstable combination of In and N, In and N are less likely to grow into a crystal structure. In this regard, the first active layer 15a is made of InGaAs obtained by incorporation of In to GaAs and the second active layer 15b is made of GaNAs obtained by incorporation of N to GaAs. Semiconductor layers except for the active layer 15 may be made of the same or similar compounds as used in an optical device according to the first embodiment of the present invention.

In an optical device having the quantum well structure according to the third embodiment of the present invention, a slight crystal growth due to unstable combination of In and N can be solved. Further, when a driving voltage is applied, the degree of an asymmetric distribution of electrons and holes decreases, thereby enhancing luminous efficiency.

As is apparent from the above description, an optical device of the present invention has a quantum well of an energy bandgap grading structure or an energy bandgap step structure. Therefore, electrons and holes are symmetrically distributed, thereby increasing the luminous efficiency of the optical device. Furthermore, a driving voltage decreases and the reliability of the optical device is enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An optical device comprising:
   two active layers formed one onto the other, made of a Group III-V semiconductor compound, and having a quantum well of a bandgap step structure in which conduction band energies and valence band energies have different energy levels while energy bandgaps between the conduction band energies and valence band energies are maintained at a predetermined value; and
   two barrier layers, one of which is positioned on an upper surface of one of the active layers and the other is positioned on a lower surface of the other active layer, and which are made of a Group III-V semiconductor compound and have higher conduction band energy and lower valence band energy than the active layers,
   wherein the active layers are respectively made of $In_xGa_{1-x}As$ where $0<x<1$ and $GaN_xAs_{1-x}$ where $0<x<1$.

2. An optical device comprising:
   two active layers formed one onto the other, made of a Group III-V semiconductor compound, and having a quantum well of a bandgap step structure in which conduction band energies and valence band energies have different energy levels while energy bandgaps between the conduction band energies and valence band energies are maintained at a predetermined value; and
   two barrier layers, one of which is positioned on an upper surface of one of the active layers and the other is positioned on a lower surface of the other active layer, and which are made of a Group III-V semiconductor compound and have higher conduction band energy than the highest conduction band energy of the active layers and lower valence band energy than the lowest valence band energy of the active layers,
   wherein the active layers are respectively made of $In_xGa_{1-x}As$ where $0<x<1$ and $GaN_xAs_{1-x}$ where $0<x<1$.

3. The optical device according to claim 2, wherein the energy bandgaps of the active layers are maintained at 1 eV or less.

4. The optical device according to claim 3, wherein the difference between the valence band energies of the active layers is 0.3 eV or more.

5. The optical device according to claim 2, wherein the barrier layers are made of $Al_xGa_{1-x}As$ where $0<x<1$.

6. The optical device according to claim 5, wherein the barrier layers have an energy bandgap of 1.2 to 3.4 eV.

7. The optical device according to claim 5, wherein intermediate layers are interposed between one of the active layers and one of the barrier layers and between the other active layer and the other barrier layer.

8. The optical device according to claim 7, wherein the intermediate layers are made of $Ga_{1-x}In_xAs$ where $0<x<0.6$.

9. The optical device according to claim 7, wherein the intermediate layers are made of $GaN_xAs_{1-x}$ where $0<x<0.1$.

* * * * *

UNITED STATES PATENT AND TRADEMARK OFFICE
CERTIFICATE OF CORRECTION

PATENT NO. : 7,800,129 B2
APPLICATION NO. : 11/798847
DATED : September 21, 2010
INVENTOR(S) : Dae-sung Song It is certified that error appears in the above-identified patent and that said Letters Patent is hereby corrected as shown below:

Title Page, item (30) Foreign Application Priority Data should read as follows:

Jan. 10, 2003    (KR) ............ 2003-1609

Signed and Sealed this

Twenty-third Day of November, 2010

David J. Kappos
*Director of the United States Patent and Trademark Office*